United States Patent
Suzuki et al.

(10) Patent No.: US 9,985,519 B2
(45) Date of Patent: May 29, 2018

(54) VOLTAGE GENERATION CIRCUIT

(71) Applicant: TOSHIBA MEMORY CORPORATION, Minato-ku, Tokyo (JP)

(72) Inventors: Yoshinao Suzuki, Yokohama, Kanagawa (JP); Michio Nakagawa, Yokohama, Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days. days.

(21) Appl. No.: 15/440,255

(22) Filed: Feb. 23, 2017

(65) Prior Publication Data

US 2017/0163146 A1    Jun. 8, 2017

Related U.S. Application Data

(63) Continuation of application No. PCT/JP2014/072282, filed on Aug. 26, 2014.

(51) Int. Cl.
*H02M 3/07* (2006.01)
*G11C 16/30* (2006.01)

(52) U.S. Cl.
CPC ............. *H02M 3/07* (2013.01); *G11C 16/30* (2013.01)

(58) Field of Classification Search
CPC .................................. H02M 3/07; G05F 1/56
See application file for complete search history.

(56) References Cited

U.S. PATENT DOCUMENTS

| 6,617,832 B1* | 9/2003 | Kobayashi | H02M 3/07 323/266 |
| 7,187,159 B2* | 3/2007 | Katoh | H02M 3/07 323/285 |
| 7,304,871 B2* | 12/2007 | Ito | H02M 3/07 327/108 |
| 7,414,890 B2 | 8/2008 | Byeon et al. | |

(Continued)

FOREIGN PATENT DOCUMENTS

| JP | 08190437 A | 7/1996 |
| JP | 2004297953 A | 10/2004 |

(Continued)

OTHER PUBLICATIONS

International Preliminary Report on Patentability (IPRP) and Written Opinion dated Mar. 9, 2017, issued in International Application No. PCT/JP2014/072282.

(Continued)

*Primary Examiner* — Patrick O'Neill
(74) *Attorney, Agent, or Firm* — Holtz, Holtz & Volek PC

(57) ABSTRACT

According to one embodiment, a voltage generation circuit includes: a charge pump circuit configured to boost a voltage input to a first node and output a first signal to a second node; an operational amplifier configured to receive a first reference voltage and a first voltage obtained by dividing a voltage of the second node and output a second signal to a third node; a first transistor having a gate coupled to the third node, one terminal coupled to a power supply, and the other terminal coupled to the first node; a logic circuit configured to detect the voltage of the second node and output a third signal; and a charge-up circuit configured to receive the third signal and charge a voltage of the third node.

14 Claims, 10 Drawing Sheets

(56) References Cited

U.S. PATENT DOCUMENTS

| | | | |
|---|---|---|---|
| 7,512,010 B2 | 3/2009 | Cho et al. | |
| 7,560,915 B2* | 7/2009 | Ito | H02M 1/32 |
| | | | 323/266 |
| 7,675,350 B2 | 3/2010 | Lee | |
| 7,697,342 B2 | 4/2010 | Byeon et al. | |
| 7,764,525 B2* | 7/2010 | Hsieh | H02M 3/07 |
| | | | 327/536 |
| 7,965,558 B2 | 6/2011 | Chae et al. | |
| 8,035,441 B2 | 10/2011 | Kim et al. | |
| 9,154,027 B2* | 10/2015 | Huynh | H02M 3/07 |
| 2002/0031032 A1 | 3/2002 | Ooishi | |
| 2005/0258891 A1 | 11/2005 | Ito et al. | |
| 2006/0012354 A1 | 1/2006 | Nunokawa et al. | |
| 2006/0146583 A1 | 7/2006 | Naka et al. | |
| 2009/0315598 A1 | 12/2009 | Namekawa | |
| 2010/0171372 A1 | 7/2010 | Kim et al. | |
| 2012/0081175 A1 | 4/2012 | Shin | |
| 2012/0105036 A1 | 5/2012 | Midorikawa et al. | |

FOREIGN PATENT DOCUMENTS

| | | |
|---|---|---|
| JP | 2006014581 A | 1/2006 |
| JP | 2006031158 A | 2/2006 |
| JP | 2006054959 A | 2/2006 |
| JP | 2007336753 A | 12/2007 |
| JP | 2008086165 A | 4/2008 |
| JP | 2010004717 A | 1/2010 |
| JP | 2011253217 A | 12/2011 |

OTHER PUBLICATIONS

International Search Report (ISR) and Written Opinion dated Nov. 18, 2014 issued in International Application No. PCT/JP2014/072282.

Taiwanese Office Action dated Mar. 18, 2016 issued in counterpart Taiwanese Patent Application No. 103130461.

* cited by examiner

| FLG1 | FLG2 | SET1 | RST1 | OUT1 |
|---|---|---|---|---|
| 0 | 0 | 0 | 1 | 1 |
| 0 | 1 | 1 | 1 | Keep state |
| 1 | 0 | 1 | 1 | Keep state |
| 1 | 1 | 1 | 0 | 0 |

FIG. 4

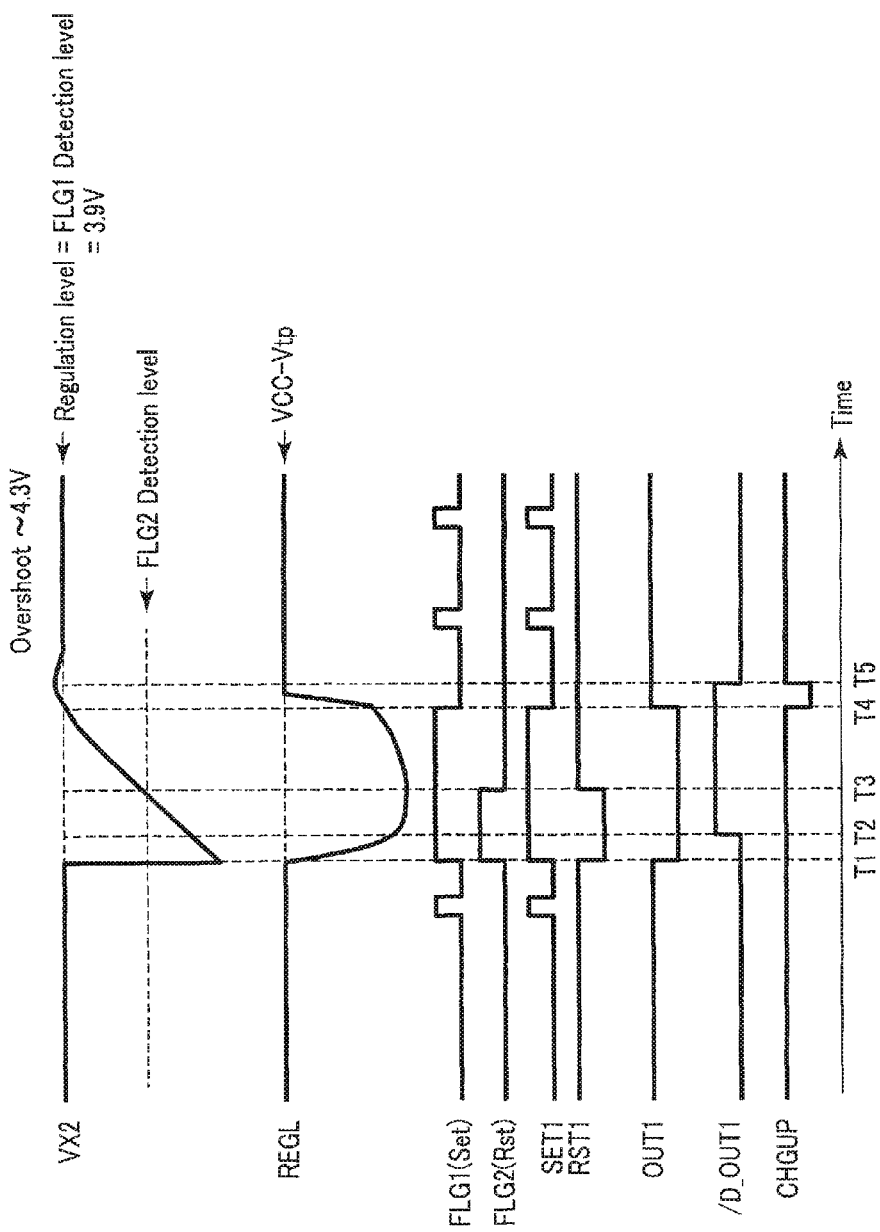
F I G. 5

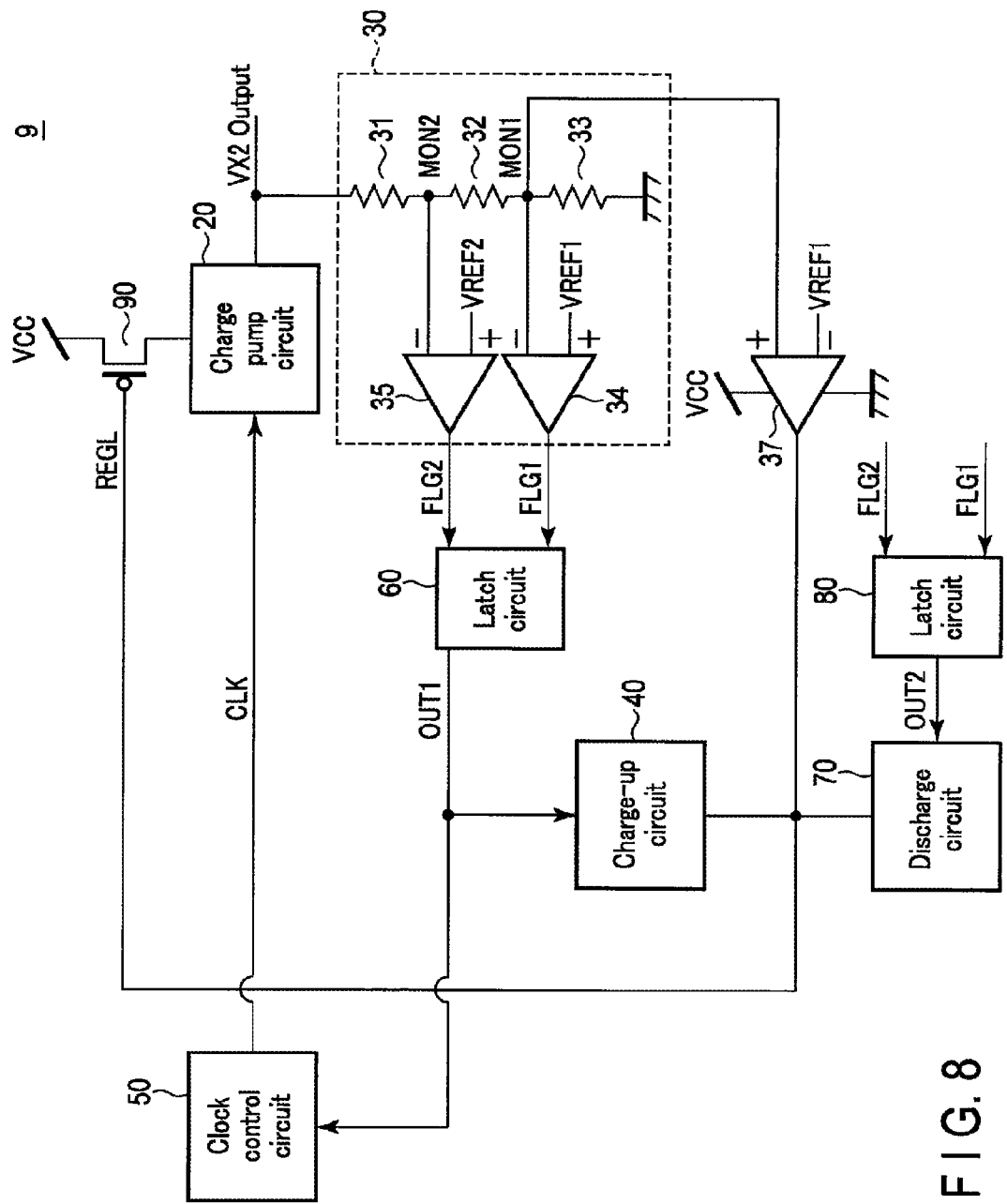
F I G. 8

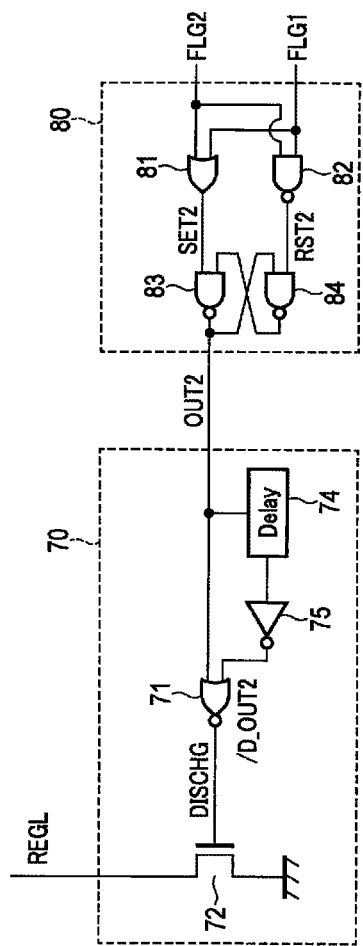
F I G. 9

VOLTAGE GENERATION CIRCUIT

CROSS REFERENCE TO RELATED APPLICATIONS

This application is a Continuation Application of PCT Application No. PCT/JP2014/072282, filed Aug. 26, 2014, the entire contents of which are incorporated herein by reference.

FIELD

Embodiments described herein relate generally to a voltage generation circuit.

BACKGROUND

To reduce a ripple in the output of a booster circuit (charge pump circuit) in a voltage generation circuit, there is proposed a technique of controlling the power supply voltage of a booster clock and an initial charge voltage by an operational amplifier.

BRIEF DESCRIPTION OF THE DRAWINGS

FIG. 4 is a view showing the truth values of signals output by the latch circuit shown in FIG. 3;

FIG. 5 is a timing chart showing the operation of the voltage generation circuit according to the first embodiment;

FIG. 8 is a block diagram showing the arrangement of a voltage generation circuit according to the second embodiment;

FIG. 9 is a block diagram showing the arrangements of a discharge circuit and a latch circuit shown in FIG. 8.

DETAILED DESCRIPTION

Figure 1:
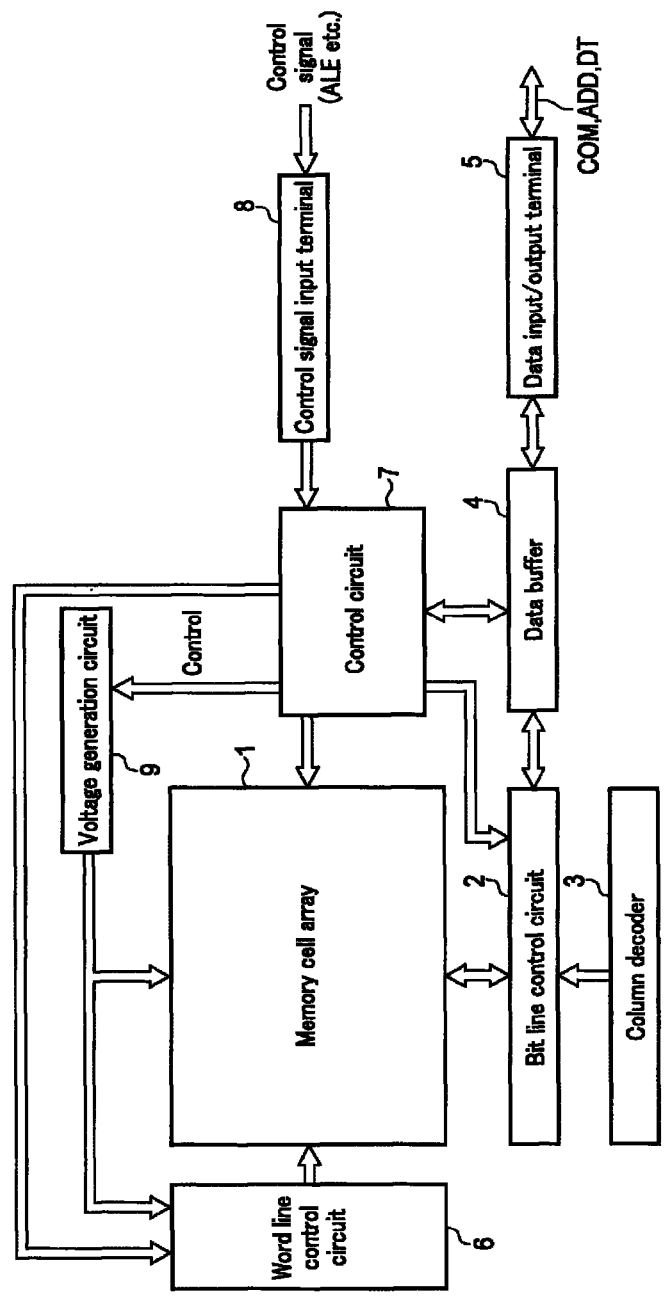
FIG. 1 is a block diagram showing the arrangement of a semiconductor storage device according to the first embodiment.

In general, according to one embodiment, a voltage generation circuit includes: a charge pump circuit configured to boost a voltage input to a first node and output a first signal to a second node; an operational amplifier configured to receive a first reference voltage and a first voltage obtained by dividing a voltage of the second node and output a second signal to a third node; a first transistor having a gate coupled to the third node, one terminal coupled to a power supply, and the other terminal coupled to the first node; a logic circuit configured to detect the voltage of the second node and output a third signal; and a charge-up circuit configured to receive the third signal and charge a voltage of the third node.

The embodiments will now be described with reference to the accompanying drawings. The same reference numerals denote the same parts throughout the drawings. A repetitive description will be made as needed.

First Embodiment

A voltage generation circuit according to the first embodiment will be described with reference to FIGS. 1, 2, 3, 4, 5, 6, and 7. In the first embodiment, a charge-up circuit 40 is provided. The charge-up circuit 40 detects that the output voltage (the voltage of a signal VX2) of a charge pump circuit 20 reaches a certain voltage. The charge-up circuit 40 then quickly charges the gate voltage of a regulation transistor 90 to a desired level. This can suppress a further rise of the output voltage of the charge pump circuit 20 and reduce the overshoot of the signal VX2. The first embodiment will be described below in detail.

Arrangement According to First Embodiment

The arrangement of the voltage generation circuit according to the first embodiment will be described below with reference to FIGS. 1, 2, 3, and 4.

As shown in FIG. 1, a semiconductor storage device (memory) includes a memory cell array 1, a bit line control circuit 2, a column decoder 3, a data buffer 4, a data input/output terminal 5, a word line control circuit 6, a control circuit 7, a control signal input terminal 8, and a voltage generation circuit 9.

Note that it is not essential to discriminate these functional blocks in this way. For example, some functions may be executed by a functional block different from a functional block exemplified in the following description. An exemplified functional block may be divided into smaller functional subblocks. The embodiment is not limited by which functional block specifies it.

An example in which the semiconductor storage device is a NAND flash memory will be described below. However, the present invention is not limited to this.

The memory cell array 1 includes a plurality of blocks. Each block includes a plurality of memory cells, a plurality of word lines, a plurality of bit lines, and the like. The plurality of memory cells store data. Each block includes a plurality of pages. The plurality of pages are formed from a plurality of memory cells. The plurality of memory cells are electrically coupled to a single word line. Each block also includes a NAND string. The NAND string is formed from a plurality of memory cells whose current paths are coupled in series. The memory cell array 1 is electrically coupled to the bit line control circuit 2, the word line control circuit 6, the control circuit 7, and the voltage generation circuit 9.

The bit line control circuit 2 reads data from the memory cells in the memory cell array 1 via the bit lines. The bit line control circuit 2 also applies a voltage necessary for write (program) to the memory cells in the memory cell array 1 via the hit lines, thereby writing data to the memory cells. The column decoder 3, the data buffer 4, and the control circuit 7 are electrically coupled to the bit line control circuit 2.

The bit line control circuit 2 includes sense amplifiers, data storage circuits, and the like (none are shown). A specific data storage circuit is selected by the column decoder 3. Data of the memory cells are read to the selected data storage circuit and output, via the data buffer 4, from the data input/output terminal 5 to the outside of the memory. The data input/output terminal 5 is coupled to a device (for example, a host or a memory controller) outside the memory.

The data input/output terminal 5 receives various kinds of commands COM and an address ADD. The various kinds of commands COM and the address ADD control the operation of the NAND flash memory. The data input/output terminal 5 also receives or outputs data DT. The write data DT is input to the data input/output terminal 5. The write data DT is supplied, via the data buffer 4, to a data storage circuit selected by the column decoder 3. The commands COM and the address ADD are supplied to the control circuit 7. A sense amplifier amplifies a potential on a bit line.

The word line control circuit 6 selects a word line in the memory cell array 1 under the control of the control circuit 7. The word line control circuit 6 also receives a voltage necessary for read, write, or erase from the voltage generation circuit 9. The word line control circuit 6 applies these voltages to the selected word line.

The control circuit 7 is electrically coupled to the memory cell array 1, the bit line control circuit 2, the column decoder 3, the data buffer 4, the word line control circuit 6, and the voltage generation circuit 9 and controls them. The control circuit 7 is electrically coupled to the control signal input terminal 8. The control circuit 7 is controlled by a control signal such as an ALE (Address Latch Enable) signal input from outside via the control signal input terminal 8. The control circuit 7 also outputs a control signal to the voltage generation circuit 9 and controls the voltage generation circuit 9.

In operations such as write, read, and erase, the voltage generation circuit 9 applies necessary voltages to the memory cell array 1, the word line control circuit 6, and the like under the control of the control circuit 7. The voltage generation circuit 9 is configured to generate such various voltages. Details of the arrangement of the voltage generation circuit 9 will be described later with reference to FIG. 2.

Figure 2:
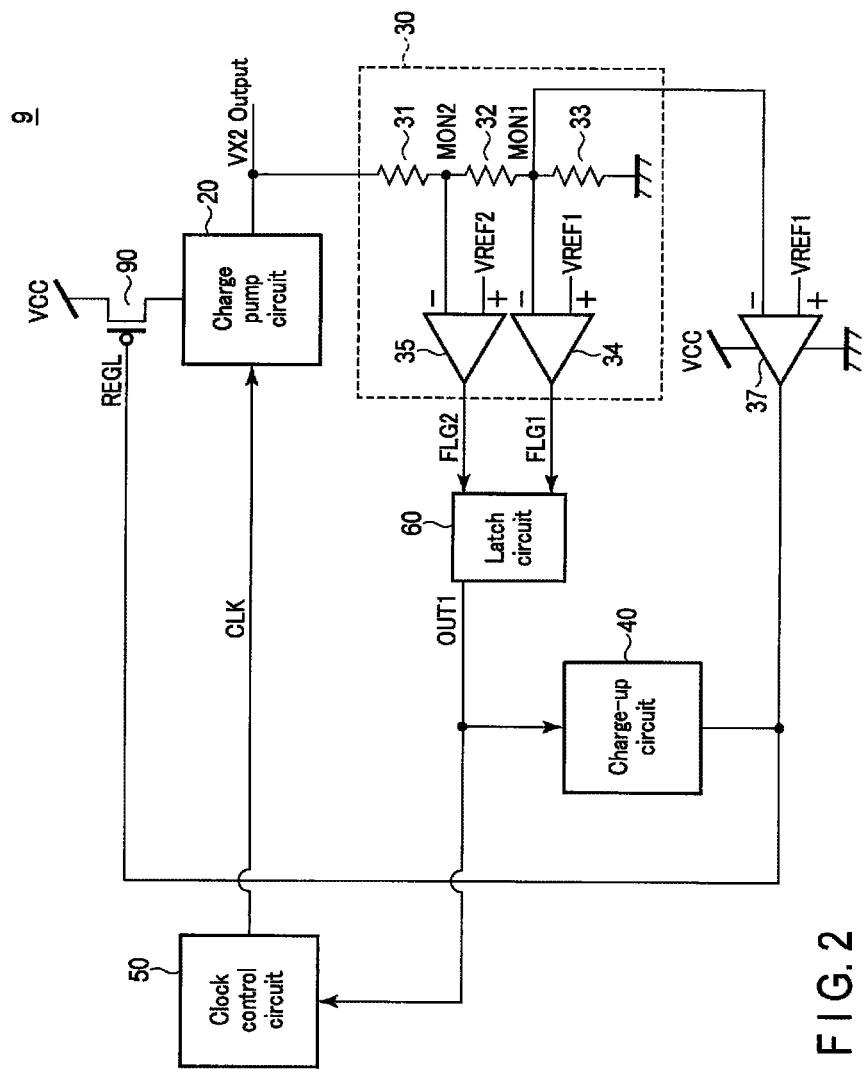
FIG. 2 is a block diagram showing the arrangement of a voltage generation circuit according to the first embodiment.

As shown in FIG. 2, the voltage generation circuit 9 includes the charge pump circuit 20, a limiter circuit 30, an operational amplifier 37, the charge-up circuit 40, a clock control circuit 50, a latch circuit 60, and the regulation transistor 90.

The charge pump circuit 20 receives a clock CLK from the clock control circuit 50. According to the clock CLK, the charge pump circuit 20 boosts a voltage transferred from the regulation transistor 90. The charge pump circuit 20 outputs the boosted voltage as the signal VX2 from the output terminal (output node). The signal VX2 is output as a voltage necessary for write, read, erase, and the like.

A node MON1 is a node that divides the voltage of the signal VX2 from the output node. The voltage (the voltage divided by resistive elements 31 to 33) of the node MON1 will be referred to as Vmon1. A node MON2 is a node that divides the voltage of the signal VX2 from the output node. The voltage (the voltage divided by the resistive elements 31 to 33) of the node MON2 will be referred to as Vmon2.

The operational amplifier 37 includes a first input terminal and a second input terminal. The voltage Vmon1 of the node MON1 is input to the first input terminal. A first reference voltage VREF1 is input to the second input terminal. The operational amplifier 37 compares the first reference voltage VREF1 with the voltage Vmon1 and outputs a regulation signal REGL.

The operational amplifier 37 is electrically coupled to a power supply voltage VCC and the ground potential. If the voltage Vmon1 is lower than the first reference voltage VREF1, the operational amplifier 37 discharges and outputs the regulation signal REGL. If the voltage Vmon1 is higher than the first reference voltage VREF1, the operational amplifier 37 charges and outputs the regulation signal REGL.

The regulation signal REGL is input to the gate of the regulation transistor (PMOS transistor) 90. One end of the current path of the regulation transistor 90 is coupled to the power supply voltage, and the other end is coupled to the input terminal (input node) of the charge pump circuit 20. The regulation transistor 90 transfers a voltage to the charge pump circuit 20 in accordance with the regulation signal REGL.

The limiter circuit 30 detects the level (voltage) of the signal VX2, and accordingly outputs flags FLG1 and FLG2. The limiter circuit 30 includes the resistive elements 31 to 33 and comparators 34 and 35.

The resistive element 31 has one terminal electrically coupled to the output terminal of the charge pump circuit 20 and the other terminal electrically coupled to the node MON2. The resistive element 32 has one terminal electrically coupled to the node MON2 and the other terminal electrically coupled to the node MON1. The resistive element 33 has one terminal electrically coupled to the node MON1 and the other terminal electrically coupled to the ground potential.

The comparator 34 includes a first input terminal and a second input terminal. The voltage Vmon1 of the node MON1 is input to the first input terminal. The first reference voltage VREF1 is input to the second input terminal. The comparator 34 compares the first reference voltage VREF1 with the voltage Vmon1 and outputs the flag FLG1. If the voltage Vmon1 is lower than the first reference voltage VREF1, the comparator 34 outputs the flag FLG1 of "H" level. If the voltage Vmon1 is higher than the first reference voltage VREF1, the comparator 34 outputs the flag FLG1 of "L" level.

The comparator 35 includes a first input terminal and a second input terminal. The voltage Vmon2 of the node MON2 is input to the first input terminal. A second reference voltage VREF2 (VREF1 equals VREF2, though the present invention is not limited to this, and they may be different) is input to the second input terminal. The comparator 35 compares the second reference voltage VREF2 with the voltage Vmon2 and outputs the flag FLG2. If the voltage VMon2 is lower than the second reference voltage VREF2, the comparator 35 outputs the flag FLG2 of "H" level. If the voltage Vmon2 is higher than the second reference voltage VREF2, the comparator 35 outputs the flag FLG2 of "L" level.

The latch circuit 60 latches the flags FLG1 and FLG2 input from the limiter circuit 30 (comparators 34 and 35), and outputs a signal OUT1 in accordance with the flags FLG1 and FLG2. If both the flags FLG1 and FLG2 change to "H" level, the latch circuit 60 is set in a reset state (standby state). After that, if both the flags FLG1 and FLG2 change to "L" level, the latch circuit 60 outputs the signal OUT1 of "H" level only during an appropriate period. The appropriate period is a period until the output voltage becomes lower than the flag FLG2 detection level, that is, until the flag FLG2 changes to "H" level. As the latch circuit 60, for example, an SR (Set-Reset) flip-flop circuit is used. Details of the arrangement of the latch circuit 60 will be described later with reference to FIG. 3.

The charge-up circuit 40 includes an input terminal and an output terminal. The signal OUT1 is input to the input terminal. The output terminal is electrically coupled to the output terminal of the operational amplifier 37. That is, the charge-up circuit 40 charges the gate voltage of the regulation transistor 90 in accordance with the signal OUT1 input from the latch circuit 60. Details of the arrangement of the charge-up circuit 40 will be described later with reference to FIG. 3.

The clock control circuit 50 generates and outputs the clock CLK in accordance with the signal OUT1 input from the latch circuit 60. If the signal OUT1 is "L" level, the clock control circuit 50 outputs a quick clock CLK signal. If the signal OUT1 is "H" level, the clock control circuit 50 outputs a slow clock CLK signal.

Figure 3:
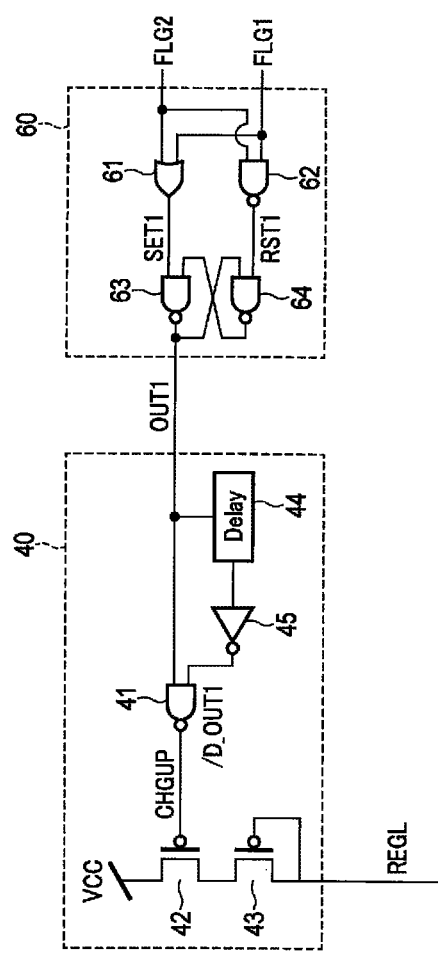
FIG. 3 is a block diagram showing the arrangements of a charge pump circuit and a latch circuit shown in FIG. 2.

As shown in FIG. 3, the latch circuit 60 includes an OR gate 61 and NAND gates 62 to 64.

The OR gate 61 performs the OR operation between the input flags FLG1 and FLG2, and outputs the result as a signal SET1. The NAND gate 62 performs the NAND operation between the input flags FLG1 and FLG2, and outputs the result as a signal RST1. The NAND gate 63 performs the NAND operation between the signal SET1 input from the OR gate 61 and a signal input from the NAND gate 64, and outputs the result as the signal OUT1. The NAND gate 64 performs the NAND operation between the signal RST1 input from the NAND gate 62 and the signal OUT1 input from the NAND gate 63, and outputs the result.

As shown in FIG. 4, according to the NAND gates 63 and 64, if the signal SET1 is "L (0)" level, and the signal RST1 is "H (1)" level, the signal OUT1 of "H (1)" level is output. In addition, according to the NAND gates 63 and 64, if the signal SET1 is "H (1)" level, and the signal RST1 is "L (0)" level, the signal OUT1 of "L (0)" level is output. On the other hand, according to the NAND gates 63 and 64, if both the signals SET1 and RST1 are "H (1)" level, the current output state is held.

That is, if both the flags FLG1 and FLG2 are "L (0)" level, the signal OUT1 of "H (1)" level is output. In addition, if both the flags FLG1 and FLG2 are "H (1)" level, the signal OUT1 of "L (0)" level is output. On the other hand, if the signal levels of the flags FLG1 and FLG2 are different, the current output state is held.

Referring back to FIG. 3, the charge-up circuit 40 includes a NAND gate 41, PMOS transistors 42 and 43, a delay circuit 44, and an inverter 45.

The delay circuit 44 delays the signal OUT1 input from the latch circuit 60 (NAND gate 63) and outputs it. The delay circuit 44 delays the signal OUT1 by, for example, 10 ns. The inverter 45 inverts the signal input from the delay circuit 44, and outputs a signal /D_OUT1. The NAND gate 41 performs the NAND operation between the signal OUT1 input from the latch circuit 60 (NAND gate 63) and the signal /D_OUT1 input from the inverter 45, and outputs the result as a signal CHGUP. The signal CHGUP is input to the gate of the PMOS transistor 42. One end of the current path of the PMOS transistor 42 is coupled to the power supply voltage. One end of the current path of the PMOS transistor 43 is coupled to the other end of the current path of the PMOS transistor 42. The gate and the other end of the current path of the PMOS transistor 43 are coupled to the output terminal (output node) of the operational amplifier 37.

Operation According to First Embodiment

The operation of the voltage generation circuit according to the first embodiment will be described below with reference to FIG. 5.

An operation is shown here, in which if the output voltage (the voltage of the signal VX2) of the charge pump 20 is lowered from a certain voltage (regulation level, the flag FLG1 detection level, for example, 3.9 V) and the flag FLG2 detection level by a capacitive load (for example, a load on a bit line driver), the charge-up circuit 40 recovers the output voltage from the state to the certain voltage.

If the voltage of the signal VX2 is the certain voltage, the voltage of the regulation signal REGL is almost voltage Vcc-Vtp. The voltage Vtp is the threshold voltage of the regulation transistor 90.

The operation of the operational amplifier 37 will be described first.

As shown in FIG. 5, at time T1, if the output voltage (the voltage of the signal VX2) of the charge pump 20 is lowered from a certain voltage by a capacitive load, the operational amplifier 37 detects it. That is, the operational amplifier 37 detects that the voltage Vmon1 of the node MON1 obtained by dividing the voltage of the signal VX2 is lower than the first reference voltage VREF1. The operational amplifier 37 then discharges the voltage of the regulation signal REGL from the voltage Vcc-Vtp to the ground potential. As a result, the voltage of the signal VX2 rises.

After that, at time T4, if the voltage of the signal VX2 exceeds the certain voltage, the operational amplifier 37 detects it. That is, the operational amplifier 37 detects that the voltage Vmon1 of the node MON1 obtained by dividing the voltage of the signal VX2 is higher than the first reference voltage VREF1. The operational amplifier 37 then charges the voltage of the regulation signal REGL to the voltage Vcc-Vtp. As a result, the voltage of the signal VX2 changes to the certain voltage.

At this time, to reduce the overshoot of the voltage of the signal VX2, the comparators 34 and 35, the latch circuit 60, and the charge-up circuit 40 perform the following operations in parallel to the operational amplifier 37.

At time T1, the comparator 34 detects that the voltage Vmon1 of the node MON1 obtained by dividing the voltage of the signal VX2 is lower than the first reference voltage VREF1. The comparator 34 outputs the flag FLG1 of "H" level.

In addition, the comparator 35 detects that the voltage Vmon2 of the node MON2 obtained by dividing the voltage of the signal VX2 is lower than the second reference voltage VREF2. The comparator 35 outputs the flag FLG2 of "H" level.

When the flags FLG1 and FLG2 of "H" level are input, the OR gate 61 outputs the signal SET1 of "H" level. When the flags FLG1 and FLG2 of "H" level are input, the NAND gate 62 outputs the signal RST1 of "L" level. When the signal SET1 of "H" level is input to the NAND gate 63, and the signal RST1 of "L" level is input to the NAND gate 64, the latch circuit 60 (NAND gate 63) outputs the signal OUT1 of "L" level.

Next, at time T2, the inverter 45 inverts the signal OUT1 of "L" level delayed by the delay circuit 44, and outputs the signal /D_OUT1 of "H" level.

At time T3, the comparator 35 detects that the voltage Vmon2 of the node MON2 obtained by dividing the voltage of the signal VX2 is higher than the second reference voltage VREF2. The comparator 35 outputs the flag FLG2 of "L" level.

When the flag FLG1 of "H" level and the flag FLG2 of "L" level are input, the NAND gate 62 outputs the signal RST1 of "H" level. At this time, although the signal SET1 of "H" level is input to the NAND gate 63, and the signal RST1 of "H" level is input to the NAND gate 64, the latch circuit 60 (NAND gate 63) holds the output state. That is, the latch circuit 60 (NAND gate 63) continuously outputs the signal OUT1 of "L" level.

After that, at time T4, the comparator 34 detects that the voltage Vmon1 of the node MON1 obtained by dividing the voltage of the signal VX2 is higher than the first reference voltage VREF1. The comparator 34 outputs the flag FLG1 of "L" level.

When the flags FLG1 and FLG2 of "L" level are input, the OR gate 61 outputs the signal SET1 of "L" level. At this time, when the signal SET1 of "L" level is input to the NAND gate 63, and the signal RST1 of "H" level is input to the NAND gate 64, the latch circuit 60 (NAND gate 63) outputs the signal OUT1 of "H" level.

When the signal OUT1 of "H" level and the signal /D_OUT1 of "H" level are input, the NAND gate 41 outputs the signal CHGUP of "L" level. Accordingly, the PMOS transistor 42 is turned on. In addition, since the voltage (the voltage of the regulation signal REGL) of the output terminal of the operational amplifier 37 is lower than the voltage Vcc-Vtp, the PMOS transistor 43 is turned on. For this reason, the output terminal of the operational amplifier 37 is electrically coupled to the power supply voltage VCC via the PMOS transistors 42 and 43. As a result, the voltage of the regulation signal REGL is quickly charged up to the voltage Vcc-Vtp.

If the voltage of the regulation signal REGL reaches the voltage Vcc-Vtp, the rise of the voltage of the signal VX2 beyond the certain voltage stops. That is, the overshoot of the voltage of the signal VX2 can be reduced by quickly charging the voltage of the regulation signal REGL to the voltage Vcc-Vtp.

Note that although not illustrated in FIG. 3, the signal OUT1 of "H" level output from the latch circuit 60 is input to the clock control circuit 50. The clock control circuit 50 makes the clock CLK slow in accordance with the signal OUT1 of "H" level. This can suppress the boost operation by the charge pump 20.

After that, at time T5, the inverter 45 inverts the signal OUT1 of "H" level delayed by the delay circuit 44, and outputs the signal /D_OUT1 of "L" level.

Upon receiving the signal OUT1 of "H" level and the signal /D_OUT1 of "L" level, the NAND gate 41 outputs the signal CHGUP of "H" level. Accordingly, the PMOS transistor 42 is turned off. Note that the ON time of the PMOS transistor 42 (the time during which the signal CHGUP is "L" level) is the delay time of the delay circuit 44 and is, for example, 10 ns.

The operation of the voltage generation circuit according to the first embodiment is thus completed.

Note that the operations of the above-described comparators 34 and 35, latch circuit 60, and charge-up circuit 40 are performed when the voltage of the signal VX2 is lower than not only the flag FLG1 detection level (certain voltage) but also the flag FLG2 detection level. That is, if the voltage of the signal VX2 is lower than the flag FLG1 detection level but higher than the flag FLG2 detection level, the operations are not performed. This is because adjusting the voltage of the signal VX2 to the certain voltage when the voltage of the signal VX2 slightly rises and lowers near the certain voltage can sufficiently be done by the control of the operational amplifier 37.

Effect According to First Embodiment

Figure 6:
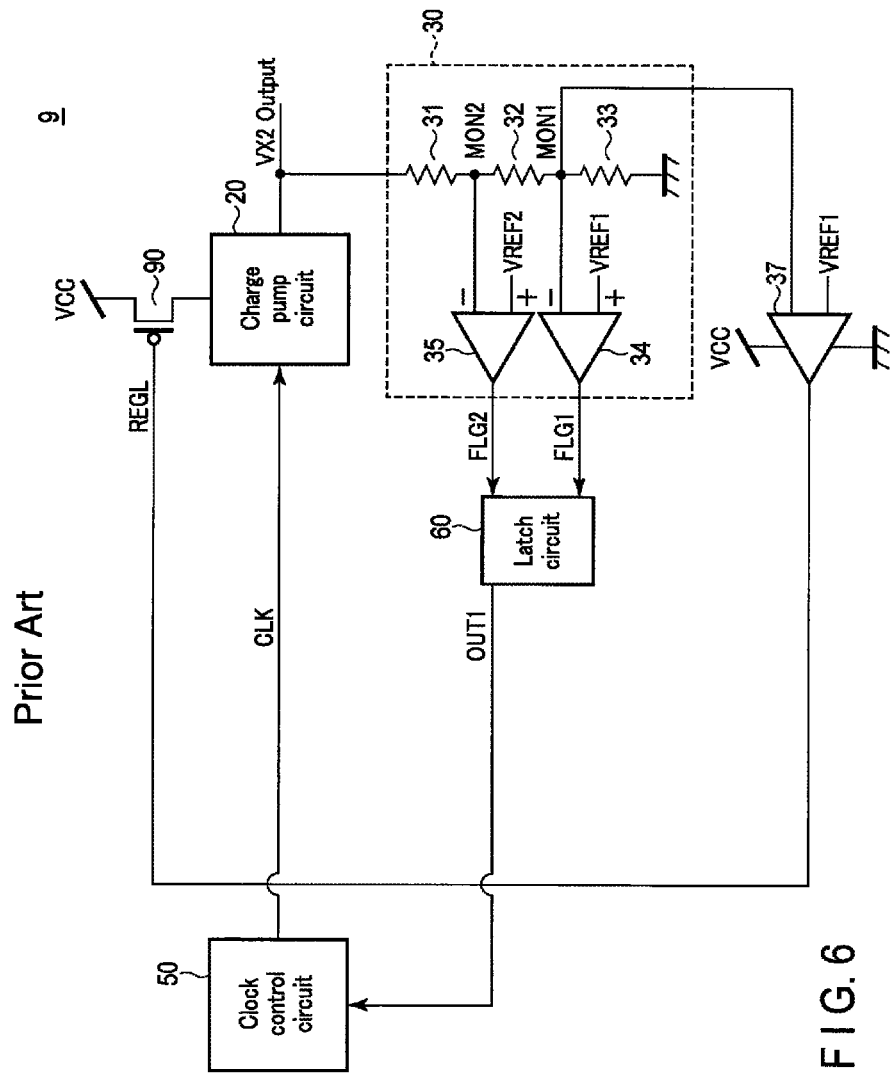
FIG. 6 is a block diagram showing the arrangement of a voltage generation circuit according to a comparative example.

As shown in FIG. 6, a voltage generation circuit 9 according to a comparative example does not include a charge-up circuit 40. Hence, in the voltage generation circuit 9 according to the comparative example, the voltage of a signal VX2 overshoots upon recovery, as shown in FIG. 7.

Figure 7:
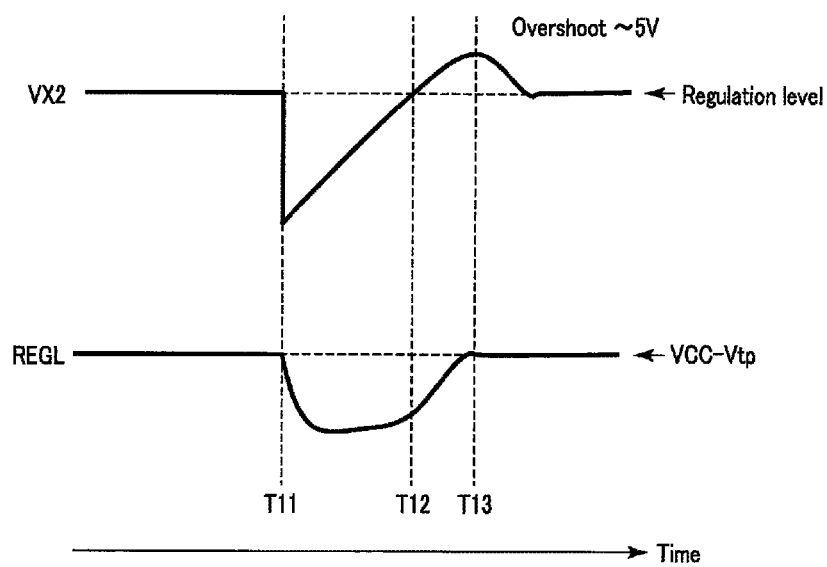
FIG. 7 is a timing chart showing the operation of the voltage generation circuit according to the comparative example.

More specifically, as shown in FIG. 7, in the comparative example, at time T11, an operational amplifier 37 detects that a voltage Vmon1 of a node MON1 obtained by dividing the voltage of the signal VX2 is lower than a first reference voltage VREF1. The operational amplifier 37 then discharges the voltage of a regulation signal REGL from a voltage Vcc-Vtp. As a result, a regulation transistor 90 operates so as to boost the voltage of the signal VX2 to the certain voltage. The voltage of the signal VX2 thus rises.

After that, at time T12, the operational amplifier 37 detects that the voltage Vmon1 of the node MON1 obtained by dividing the voltage of the signal VX2 is higher than the first reference voltage VREF1.

At time T13, the operational amplifier 37 charges the voltage of the regulation signal REGL to the voltage Vcc-Vtp. As a result, the regulation transistor 90 operates so as to change voltage of the signal VX2 to the certain voltage.

At this time, since the load (regulation transistor 90) is very large with respect to the driving capability of the operational amplifier 37, the control to charge the voltage of the regulation signal REGL to the voltage Vcc-Vtp cannot be done only by the operational amplifier 37. Hence, in the comparative example, the time (the time from time T12 to time T13) after the voltage of the signal VX2 reaches the certain voltage until the voltage of the regulation signal REGL is charged to the voltage Vcc-Vtp is long. Since the voltage of the signal VX2 continuously rises during this time, a large overshoot occurs. For example, the voltage of the signal VX2 exceeds the certain voltage of 3.9 V and rises to about 5.0 V. As a result, the voltage may exceed the breakdown voltage of a transistor (not shown) that outputs the signal VX2 or uses the signal VX2 as the Dower supply.

On the other hand, according to the first embodiment, the charge-up circuit 40 is provided. Upon detecting that the voltage of the signal VX2 reaches the certain voltage, the charge-up circuit 40 quickly charges the gate voltage of the regulation transistor 90 to a desired level. This makes it possible to control to lower the power supply voltage (the voltage transferred by the regulation transistor) input to the charge pump circuit 20 without increasing the current of the operational amplifier 37. It is therefore possible to suppress the rise of the voltage of the signal VX2 and reduce the overshoot of the voltage of the signal VX2. For example, the overshoot of the voltage of the signal VX2 can be reduced to about 4.3 V.

Second Embodiment

A voltage generation circuit according to the second embodiment will be described with reference to FIGS. 8, 9, and 10. In the second embodiment, a discharge circuit 70 is further provided. Upon detecting that the voltage of a signal VX2 lowers from a certain voltage and a flag FLG2 detection level, the discharge circuit 70 quickly discharges the gate voltage of a regulation transistor 90 to a desired level (ground potential). This makes it possible to quickly boost the voltage of the signal VX2 to the certain voltage. The second embodiment will be described below in detail.

Note that in the second embodiment, a description of the same points as in the first embodiment will be omitted, and different points will mainly be described.

Arrangement According to Second Embodiment

The arrangement of the voltage generation circuit according to the second embodiment will be described below with reference to FIGS. 8 and 9.

As shown in FIG. 8, the second embodiment is different from the first embodiment in that a voltage generation circuit 9 includes a latch circuit 80 and the discharge circuit 70.

The latch circuit 80 latches flags FLG1 and FLG2 input from comparators 34 and 35, and outputs a signal OUT1 in accordance with the flags FLG1 and FLG2. As the latch circuit 80, for example, an SR (Set-Reset) flip-flop circuit is used. Details of the arrangement of the latch circuit 80 will be described later with reference to FIG. 9.

The discharge circuit 70 includes an input terminal and an output terminal. A signal OUT2 is input to the input terminal. The output terminal is electrically coupled to the output terminal of an operational amplifier 37. That is, the discharge circuit 70 discharges the level of the gate voltage of the regulation transistor 90 in accordance with the signal OUT2 input from the latch circuit 80. Details of the arrangement of the discharge circuit 70 will be described later with reference to FIG. 9.

As shown in FIG. 9, the latch circuit 80 includes an OR gate 81 and NAND gates 82 to 84.

The OR gate 81 performs the OR operation between the input flags FLG1 and FLG2, and outputs the result as a signal SET2. The NAND gate 82 performs the NAND operation between the input flags FLG1 and FLG2, and outputs the result as a signal RST2. The NAND gate 83 performs the NAND operation between the signal SET2 input from the OR gate 81 and a signal input from the NAND gate 84, and outputs the result as the signal OUT2. The NAND gate 84 performs the NAND operation between the signal RST2 input from the NAND gate 82 and the signal OUT2 input from the NAND gate 83, and outputs the result.

As described above, the latch circuit 80 has the same arrangement as the latch circuit 60. Hence, as shown in. FIG. 4, according to the NAND gates 83 and 84, if the signal SET2 is "L (0)" level, and the signal RST2 is "H (1)" level, the signal OUT2 of "H (1)" level is output. In addition, according to the NAND gates 83 and 84, if the signal SET2 is "H (1)" level, and the signal RST2 is "L (0)" level, the signal OUT2 of "L (0)" level is output. On the other hand, according to the NAND gates 83 and 84, if both the signals SET2 and RST2 are "H (1)" level, the current output state is held.

That is, if both the flags FLG1 and FLG2 are "L (0)" level, the signal OUT2 of "H (1)" level is output. In addition, if both the flags FLG1 anal FLG2 are "H (1)" level, the signal OUT2 of "L (0)" level is output. On the other hand, if the signal levels of the flags FLG1 and FLG2 are different (in this example, if the flag FLG1 is "H (1)" level, and the flag FLG2 is "L (0)" level), the current output state is held.

Referring back to FIG. 9, the discharge circuit 70 includes a NOR gate 71, an NMOS transistor 72, a delay circuit 74, and an inverter 75.

The delay circuit 74 delays the signal OUT2 input from the latch circuit 80 (NAND gate 83) and outputs it. The delay circuit 74 delays the signal OUT2 by, for example, 10 ns. The inverter 75 inverts the signal input from the delay circuit 74, and outputs a signal /D_OUT2. The NOR gate 71 performs the NOR operation between the signal OUT2 input from the latch circuit 80 (NAND gate 83) and the signal /D_OUT2 input from the inverter 75, and outputs the result as a signal DISCHG. The signal DISCHG is input to the gate of the NMOS transistor 72. One end of the current path of the NMOS transistor 72 is coupled to the ground potential, and the other end of the current path is coupled to the output terminal of the operational amplifier 37.

Operation According to Second Embodiment

The operation of the voltage generation circuit according to the second embodiment will be described below with reference to FIG. 10.

As in FIG. 5, an operation is shown here, in which if the output voltage (the voltage of the signal VX2) of a charge pump 20 is lowered from a certain voltage and the flag FLG2 detection level by a capacitive load, the output voltage is recovered from the state to the certain voltage.

Figure 10:
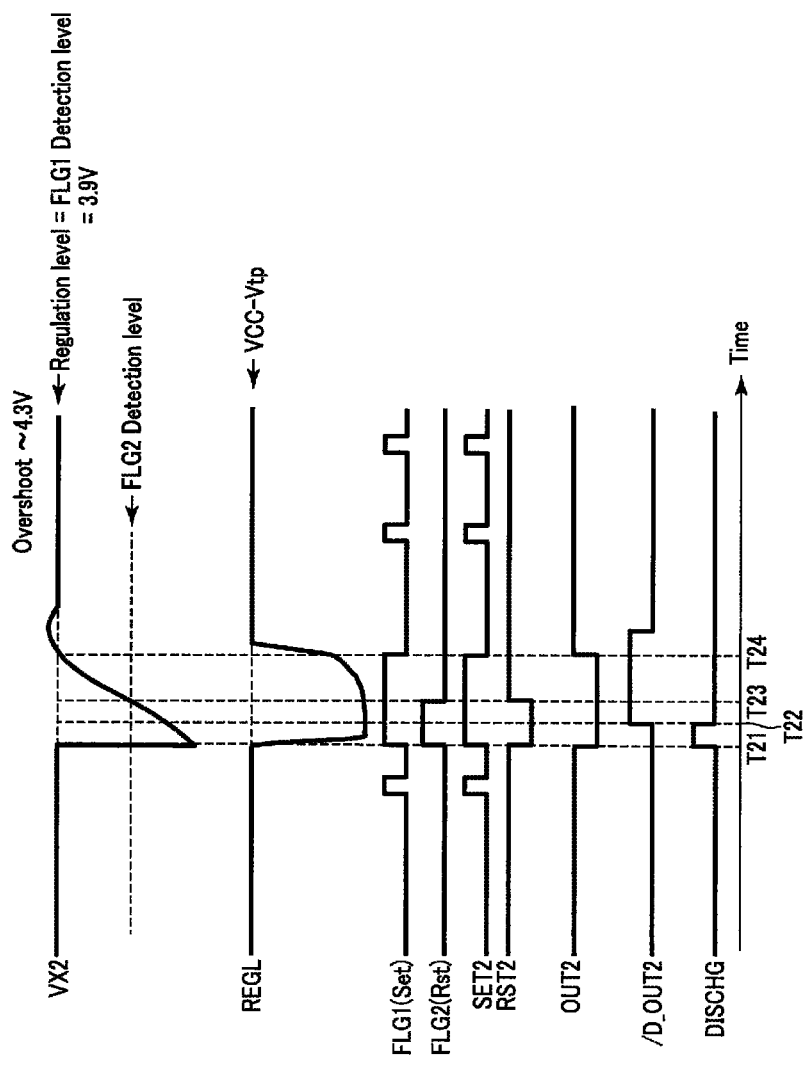
FIG. 10 is a timing chart showing the operation of the voltage generation circuit according to the second embodiment.

As shown in FIG. 10, at time T21, if the output voltage (the voltage of the signal VX2) of the charge pump 20 is lowered from a certain voltage by a capacitive load, the operational amplifier 37 performs the same operation as in the first embodiment. That is, the operational amplifier 37 discharges the voltage of the regulation signal REGL from a voltage Vcc-Vtp. As a result, the voltage of the signal VX2 rises.

On the other hand, the comparator 34 detects that a voltage Vmon1 obtained by dividing the voltage of the signal VX2 is lower than a first reference voltage VREF1. The comparator 34 outputs the flag FLG1 of "H" level.

In addition, the comparator 35 detects that the voltage Vmon2 obtained by dividing the voltage of the signal VX2 is lower than a second reference voltage VREF2 (VREF1=VREF2). The comparator 35 outputs the flag FLG2 of "H" level.

When the flags FLG1 and FLG2 of "H" level are input, the OR gate 81 outputs the signal SET2 of "H" level. When the flag FLG1 of "H" level and the flag FLG2 of "H" level are input, the NAND gate 82 outputs the signal RST2 of "L" level. When the signal SET2 of "H" level is input to the NAND gate 83, and the signal RST2 of "L" level is input to the NAND gate 84, the latch circuit 80 (NAND gate 83) outputs the signal OUT2 of "L" level.

When the signal OUT2 of "L" level and the signal /D_OUT2 of "L" level are input, the NOR gate 71 outputs the signal DISCHG of "H" level. Accordingly, the NMOS transistor 72 is turned on. For this reason, the output terminal of the operational amplifier 37 is electrically coupled to the ground potential via the NMOS transistor 72. As a result, the voltage of the regulation signal REGL is quickly discharged up to the ground potential.

The voltage of the signal VX2 can quickly be boosted by quickly discharging the voltage of the regulation signal REGL. It is therefore possible to recover the lowered voltage of the signal VX2 to the certain voltage in a short time. That is, the time from time T21 to time T24 (to be described later) in the second embodiment can be made shorter than the time from time T1 to time T4 in the first embodiment.

Next, at time T22, the inverter 75 inverts the signal OUT2 of "L" level delayed by the delay circuit 74, and outputs the signal /D_OUT2 of "H" level.

When the signal OUT2 of "L" level and the signal /D_OUT2 of "H" level are input, the NOR gate 71 outputs the signal DISCHG of "L" level. Accordingly, the NMOS transistor 72 is turned off. Note that the ON time of the NMOS transistor 72 (the time during which the signal DISCHG is "H" level) is the delay time of the delay circuit 74 and is, for example, 10 ns.

Next, at time T23, the comparator 35 detects that a voltage Vmon2 obtained by dividing the voltage of the signal VX2 is higher than the second reference voltage VREF2. The comparator 35 outputs the flag FLG2 of "L" level.

When the flag FLG1 of "H" level and the flag FLG2 of "L" level are input, the NAND gate 82 outputs the signal RST2 of "H" level. At this time, although the signal SET2 of "H" level is input to the NAND gate 83, and the signal RST2 of "H" level is input to the NAND gate 83, the latch circuit 80 (NAND gate 83) holds the output state. That is, the latch circuit 80 (HAND gate 83) continuously outputs the signal OUT2 of "L" level.

After that, at time T24, the comparator 34 detects that the voltage Vmon1 obtained by dividing the voltage of the signal VX2 is higher than the first reference voltage VREF1. The comparator 34 outputs the flag FLG1 of "L" level.

When the flag FLG1 of "L" level and the flag FLG2 of "L" level are input, the OR gate 81 outputs the signal SET2 of "L" level. At this time, when the signal SET2 of "L" level is input to the NAND gate 83, and the signal RST2 of "H" level is input to the NAND gate 84, the latch circuit 80 (NAND gate 83) outputs the signal OUT2 of "H" level.

Note that in the second embodiment as well, a latch circuit 60 and a charge-up circuit 40 operate as in the first embodiment from time T21 to time T24. That is, the latch circuit 60 and the charge-up circuit 40 operate in parallel to the latch circuit 80 and the discharge circuit 70.

The operation of the voltage generation circuit according to the second embodiment is thus completed.

Effect According to Second Embodiment

According to the second embodiment, the discharge circuit 70 is Provided. Upon detecting that the voltage of the signal VX2 lowers from the certain voltage and the flag FLG2 detection level, the discharge circuit 70 quickly discharges the gate voltage of the regulation transistor 90 to the ground potential. This makes it possible to control to raise the power supply voltage (the voltage transferred by the regulation transistor; of the charge pump circuit 20. It is therefore possible to quickly boost the voltage of the signal VX2 to the certain voltage.

While certain embodiments of the inventions have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The appended claims and their equivalents are intended to cover such forms or modifications as would fall within the scope and spirit of the inventions.

What is claimed is:

1. A voltage generation circuit comprising:
   a charge pump circuit configured to boost a voltage input to a first node and output a first signal to a second node;
   an operational amplifier configured to receive a first reference voltage and a first voltage obtained by dividing a voltage of the second node and output a second signal to a third node;
   a first transistor having a gate coupled to the third node, one terminal coupled to a power supply, and the other terminal coupled to the first node;
   a logic circuit configured to detect the voltage of the second node and output a third signal; and
   a charge up circuit configured to receive the third signal and charge a voltage of the third node,
   wherein the charge-up circuit comprises:
   a first PMOS transistor having a gate configured to receive a fourth signal based on the third signal and one terminal coupled to a power supply voltage; and
   a second PMOS transistor having one terminal coupled to the other terminal of the first PMOS transistor and the other terminal and a gate coupled to the third node.

2. The voltage generation circuit of claim 1, wherein the charge-up circuit further comprises a first NAND gate configured to perform a NAND operation between the third signal and a fifth signal obtained by delaying and inverting the third signal and output a result as the fourth signal.

3. The voltage generation circuit of claim 1, wherein the logic circuit includes a limiter circuit comprising:
   a first comparator configured to compare the first reference voltage with a voltage based on the voltage of the second node and output a first flag; and
   a second comparator configured to compare a second reference voltage equal to the first reference voltage with the voltage based on the voltage of the second node and output a second flag.

4. The voltage generation circuit of claim 3, wherein the logic circuit includes a first latch circuit that is an SR flip-flop circuit.

5. The voltage generation circuit of claim 3, wherein the logic circuit includes a first latch circuit comprising:
   a first OR gate configured to perform an OR operation between the first flag and the second flag and output a result as a sixth signal;
   a second NAND gate configured to perform a NAND operation between the first flag and the second flag and output a result as a seventh signal;
   a third NAND gate configured to perform a NAND operation between the seventh signal and the third signal and output a result as an eighth signal; and
   a fourth NAND gate configured to perform a NAND operation between the sixth signal and the eighth signal and output a result as the third signal.

6. The voltage generation circuit of claim 1, further comprising a clock control circuit configured to output a clock signal in accordance with the third signal,
   wherein the charge pump circuit controls boost of a voltage of the first node in accordance with the clock signal.

7. The voltage generation circuit of claim 3, further comprising:
   a second latch circuit configured to output a ninth signal in accordance with the first flag and the second flag; and
   a discharge circuit configured to discharge a voltage of the third node in accordance with the ninth signal.

8. The voltage generation circuit of claim 7, wherein the discharge circuit comprises a first NMOS transistor having a gate configured to receive a 10th signal based on the ninth signal and one terminal coupled to a ground potential.

9. The voltage generation circuit of claim 8, wherein the discharge circuit further comprises a first NOR gate configured to perform a NOR operation between the ninth signal and an 11th signal obtained by delaying and inverting the ninth signal and output a result as the 10th signal.

10. The voltage generation circuit of claim 7, wherein the second latch circuit comprises:
    a second OR gate configured to perform an OR operation between the first flag and the second flag and output a result as a 12th signal;
    a fifth NAND gate configured to perform a NAND operation between the first flag and the second flag and output a result as a 13th signal;
    a sixth NAND gate configured to perform a NAND operation between the 13th signal and the ninth signal and output a result as a 14th signal; and a seventh NAND gate configured to perform a NAND operation between the 12th signal and the 14th signal and output a result as the ninth signal.

11. A voltage generation circuit comprising:
a charge pump circuit configured to boost a voltage input to a first node and output a first signal to a second node;
an operational amplifier configured to receive a first reference voltage and a first voltage obtained by dividing a voltage of the second node and output a second signal to a third node;
a first transistor having a gate coupled to the third node, one terminal coupled to a power supply, and the other terminal coupled to the first node;
a logic circuit configured to detect the voltage of the second node and output a third signal;
a first latch circuit configured to receive the third signal and output a fourth signal; and
a discharge circuit configured to receive the fourth signal and discharge a voltage of the third node.

12. The voltage generation circuit of claim 11, wherein the discharge circuit comprises a first NMOS transistor having a gate configured to receive a fifth signal based on the fourth signal and one terminal coupled to a ground potential.

13. The voltage generation circuit of claim 12, wherein the discharge circuit further comprises a first NOR gate configured to perform a NOR operation between the fourth signal and a sixth signal obtained by delaying and inverting the fourth signal and output a result as the fifth signal.

14. The voltage generation circuit of claim 11, wherein the first latch circuit comprises:
a first OR gate configured to perform an OR operation between a first flag and a second flag and output a result as a seventh signal;
a first NAND gate configured to perform a NAND operation between the first flag and the second flag and output a result as an eighth signal;
a second NAND gate configured to perform a NAND operation between the eighth signal and the fourth signal and output a result as a ninth signal; and
a third NAND gate configured to perform a NAND operation between the seventh signal and the ninth signal and output a result as the fourth signal.

* * * * *